United States Patent
Geissdörfer et al.

(10) Patent No.: US 9,859,870 B2
(45) Date of Patent: Jan. 2, 2018

(54) CONTROL FACILITY WITH ADAPTIVE FAULT COMPENSATION

(71) Applicant: Siemens Aktiengesellschaft, München (DE)

(72) Inventors: Klaus Geissdörfer, Erlangen (DE); Carsten Hamm, Erlangen (DE); Markus Stephan Haschka, Nürnberg (DE); Elmar Schäfers, Fürth (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 316 days.

(21) Appl. No.: 14/829,345

(22) Filed: Aug. 18, 2015

(65) Prior Publication Data
US 2016/0056794 A1 Feb. 25, 2016

(30) Foreign Application Priority Data
Aug. 19, 2014 (EP) .................................... 14181404

(51) Int. Cl.
| H03H 17/06 | (2006.01) |
| G05B 5/01 | (2006.01) |
| G05B 15/02 | (2006.01) |

(52) U.S. Cl.
CPC .............. *H03H 17/06* (2013.01); *G05B 5/01* (2013.01); *G05B 15/02* (2013.01)

(58) Field of Classification Search
None
See application file for complete search history.

(56) References Cited

U.S. PATENT DOCUMENTS

| 5,053,983 A * | 10/1991 | Hyatt ............... B60R 16/0373 |
| | | 708/306 |
| 6,982,536 B2 | 1/2006 | Geissdörfer et al. |

(Continued)

FOREIGN PATENT DOCUMENTS

| EP | 1580406 A1 | 9/2005 |
| EP | 2116912 A1 | 11/2009 |

OTHER PUBLICATIONS

Dort et al., U.S. Pat. No. 8,978,503, Mar. 17, 2015, 2013-0031994, Feb. 7, 2013.

(Continued)

*Primary Examiner* — Michael D Yaary
(74) *Attorney, Agent, or Firm* — Henry M. Feiereisen LLC

(57) ABSTRACT

A control facility for controlling a controlled system experiencing a disturbance includes a front nodal point receiving a target value and an actual value outputted by the controlled system and supplying a difference value corresponding to a difference between the target value and the actual value to a compensation circuit. The compensation circuit supplies a frequency-filtered and time-delayed signal formed as the sum of the weighted difference value and a weighted feedback signal as an input to a controller for the controlled system. The sum of a filter delay time and of first and second propagation delays is an integer multiple of the cycle duration of the disturbance, and a sum of the filter delay time and the first propagation delay is an integer multiple of the cycle duration minus a propagation time, which elapses until a change in the target value causes a change in the actual value.

13 Claims, 6 Drawing Sheets

(56) References Cited

U.S. PATENT DOCUMENTS

| | | |
|---|---|---|
| 7,107,119 B2 | 9/2006 | Geissdörfer et al. |
| 7,236,913 B2 | 6/2007 | Hamm et al. |
| 7,299,108 B2 | 11/2007 | Geissdörfer et al. |
| 7,902,785 B2 | 3/2011 | Denk et al. |
| 8,943,112 B2 * | 1/2015 | Pagnanelli ............ H03M 3/468 708/5 |
| 2002/0027946 A1 * | 3/2002 | Ozluturk ............... G06F 13/374 375/130 |
| 2010/0092262 A1 | 4/2010 | Hamann et al. |
| 2013/0081914 A1 | 4/2013 | Ladra et al. |
| 2013/0085607 A1 | 4/2013 | Ladra et al. |
| 2013/0085617 A1 | 4/2013 | Ladra et al. |
| 2013/0160143 A1 | 6/2013 | Hamm et al. |
| 2014/0195577 A1 * | 7/2014 | Nikitin ................. H03H 7/0153 708/304 |

OTHER PUBLICATIONS

Hamm et al., U.S. Pat. No. 8,909,371, Dec. 9, 2014, 2013-0120253, May 16, 2013.
Frohnapfel et al., U.S. Pat. No. 8,917,002, Dec. 23, 2014, 2012-0293030, Nov. 22, 2012.
Fischer, U.S. Pat. No. 8,157,752, Apr. 17, 2012, 2010-0032879, Feb. 11, 2010.
Bitterolf et al., U.S. Pat. No. 8,955,789, Feb. 17, 2015, 2013-0026278, Jan. 31, 2013.

\* cited by examiner

CONTROL FACILITY WITH ADAPTIVE FAULT COMPENSATION

CROSS-REFERENCES TO RELATED APPLICATIONS

This application claims the priority of European Patent Application, Serial No. EP 14181404, filed Aug. 19, 2014, pursuant to 35 U.S.C. 119(a)-(d), the content of which is incorporated herein by reference in its entirety as if fully set forth herein.

BACKGROUND OF THE INVENTION

The present invention relates to a control facility for controlling a controlled system.

The present invention further relates to a software module comprising machine code, wherein the control facility is embodied as a software-programmable control facility.

Control facilities of this type and the associated software modules are generally known.

With some controlled technical parameters, in particular position values in the case of rotary axes, periodic disturbances often occur. Such disturbances can occur for instance on account of inertia or processing forces in machine tools or other production machines. A suppression of such disturbances significantly improves the quality of the closed loop control, sometimes by more than one order of magnitude.

In order to suppress such periodic disturbances, adaptive closed loop controls are known. The relevant technical term for such adaptive closed loop controls is Repetitive Control. The precise implementation of such adaptive closed loop controls is however generally not made public by manufacturers of such closed loop controls.

It would therefore be desirable and advantageous to obviate prior art shortcomings and to provide an improved a control facility which operates in a simple and reliable manner in a control facility of the type mentioned in the introduction, in which the acquired actual value is subjected to a disturbance comprising a cycle duration, by means of which control facility the periodic fault is compensated for highly accurately.

SUMMARY OF THE INVENTION

According to one aspect of the present invention, a control facility includes
 a front nodal point having a first input receiving a target value and a second input receiving an actual value outputted by the controlled system, said actual value comprising a disturbance having a cycle duration, the front nodal point further having an output supplying a difference value corresponding to a difference between the target value and the actual value,
 a compensation circuit receiving the difference value and supplying a compensation signal,
 a rear nodal point having a first input receiving the difference value and a second input receiving the compensation signal, and further having an output supplying a sum value corresponding to a sum of the difference value and the compensation signal, and
 a controller receiving the sum value and supplying a control signal to the controlled system,
wherein the compensation circuit comprises
 a first multiplier circuit forming a first product by multiplying the difference value with a first weighting factor,
 a second multiplier circuit forming a second product by multiplying a feedback signal with a second weighting factor,
wherein the feedback signal is generated by
 frequency filtering, with a frequency filter having a filter delay time, a sum signal outputted by an inner nodal point and representing a sum of the first product and the second product, and by
 time-delaying the sum in a front buffer store having a first propagation delay and supplying the compensation signal,
 and thereafter time-delaying the compensation signal in a rear buffer store arranged downstream of the front buffer store and having a second propagation delay,
wherein the a sum of the filter delay time, the first propagation delay and the second propagation delay is an integer multiple of the cycle duration of the disturbance and a sum of the filter delay time and the first propagation delay is an integer multiple of the cycle duration of the disturbance minus a propagation time, which elapses until a change in the target value causes a change in the actual value.

The compensation circuit corresponds to a so-called inner model of the controlled system. Inner models are known in the field of control technology.

The frequency filter can be embodied as required. For instance the frequency filter can be embodied as a linear non-recursive digital filter (finite impulse response=FIR). Such filters have the same propagation time for all frequencies.

The frequency filter can be embodied in particular as a low pass filter. A filter order of the frequency filter can be permanently predetermined or adjustable.

Certain frequency ranges of the control deviation can be filtered by means of a non-recursive digital filter. In some instances, it is however only necessary to filter a single or a few precisely specified frequencies and to compensate for their disturbance. In such a case, the frequency filter can, alternatively to an embodiment as a non-recursive digital filter, comprise a number of orthogonal correlation filters, by means of which an individual frequency component is filtered out in each case. The number of orthogonal correlation filters amounts in such a case to a minimum of 1. It may however also be larger.

The first weighting factor determines how quickly the compensation circuit learns an occurring disturbance. The second weighting factor determines how well the compensation circuit notices a disturbance which has been learnt once. The weighting factors can be fixedly predetermined. They can however preferably be adjusted.

The output of the frequency filter can preferably be separated from the inner tapping point. With the output of the frequency filter which is separated from the inner tapping point, it is in particular easily possible to check the stability of the compensation circuit and also the control structure as a whole and if necessary parameters of the compensation circuit, in particular to adjust the filter order of the non-recursive digital filter and/or the weighting factors, such that the compensation circuit and with it the entire closed loop control also then remains stable if the compensation circuit is closed, the output of the frequency filter is therefore connected to the inner tapping point.

In particular, the first weighting factor, the second weighting factor and the frequency filter are preferably adjusted such that with an output of the frequency filter which is separated from the inner tapping point, an amplification from the inner tapping point to the output of the frequency filter irrespective of a frequency of a signal present at the inner tapping point is less than or at most equal to 1. This setting ensures, provided the actual control loop is stable as such, the stability of the control structure as a whole.

The amplification can preferably be output by way of an output facility to a user of the control facility as a function of the frequency. As a result the user obtains feedback detailing whether or not adjustments performed by him to the compensation circuit endanger the stability of the control structure as a whole.

It is possible for at least one further controller to be subordinate to the controller. In this case a pre-control signal derived from the signals stored in the front buffer store is preferably supplied to the subordinate controller. As a result the quality of the closed loop control can be still further increased.

The cycle duration of the disturbance can vary over the course of time in some instances. The cycle duration of the disturbance is often indirectly proportional to a rotational speed of the rotary axis particularly in the case of a rotary axis. In such a case, at least the delay time of the front buffer store is preferably dynamically traced according to the cycle duration.

As already mentioned, the controlled system can be embodied as a rotary axis. If in such a case the controller is embodied as a position controller, an associated position value is preferably assigned to the signals stored in the front and rear buffer store in each case. It is therewith possible when varying the cycle duration of the compensation circuit to determine the compensation signal by taking the position values assigned to the signals stored in the front and in the rear buffer store into account.

According to an advantageous feature of the present invention, the control facility may be embodied as a software-programmable control facility and may be programmed with a software module.

According to another aspect of the invention, the processing of the machine code of the software modules by a software-programmable control facility means that the control facility is embodied in accordance with the invention. The software module can be stored in machine-readable form in particular on a non-transitory data carrier.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
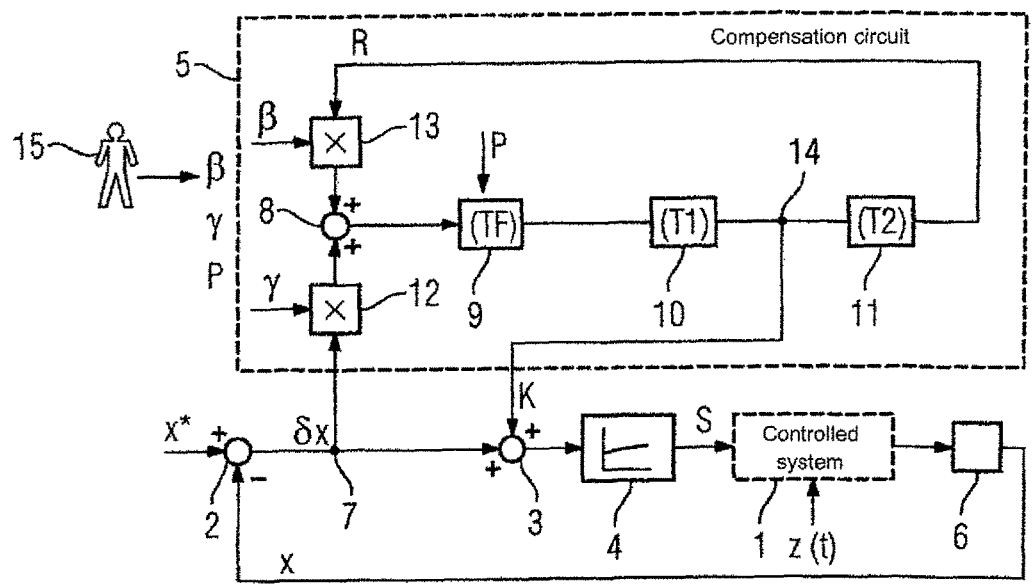
FIG. 1 shows a schematic diagram of a control facility for controlling a controlled system.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic diagrams and fragmentary views. In certain instances, details which are not necessary for an understanding of the present invention or which render other details difficult to perceive may have been omitted.

Turning now to the drawing, and in particular to FIG. 1, there is shown a control facility for controlling a controlled system 1 comprises a front nodal point 2, a rear nodal point 3, a controller 4 and a compensation circuit 5. An actual value x and a corresponding target value x* are supplied to the front nodal point 2. The actual value x is acquired using measuring technology on the output side of the controlled system 1 by means of a measuring facility 6. The front nodal point 2 determines a control deviation δx by forming the difference between target value x* and actual value x. The control deviation δx and a compensation signal K are supplied to the rear nodal point 3. The rear nodal point 3 adds the control deviation δx and the compensation signal K and as a result forms a sum signal, subsequently also referred to as external sum signal. The rear nodal point 3 supplies the external sum signal to the controller 4. The controller 4 determines a control signal S for the controlled system 1 with the aid of the external sum signal supplied thereto. The controller 4 outputs the control signal S to the controlled system 1.

Figure 2:
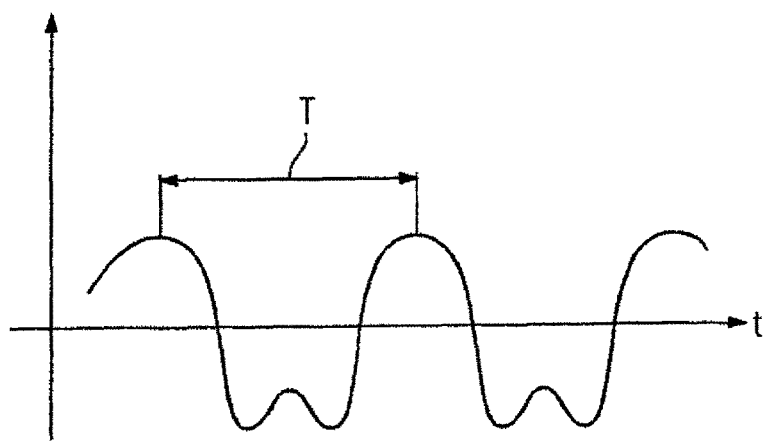
FIG. 2 shows a schematic diagram of a time-diagram of a disturbance.

The acquired actual value x is subject to a disturbance z. The disturbance z is a periodic function of time t in accordance with the diagram in FIG. 2. It therefore has a cycle duration T. The compensation circuit 5 and the compensation signal K determined by the compensation circuit 5 are used to compensate for the disturbance z.

In order to be able to determine the compensation signal K, an external tapping point 7 is arranged between the front and the rear nodal point 2, 3. The control deviation δx is tapped at the external tapping point 7 and supplied to the compensation circuit 5. The compensation circuit 5 determines the compensation signal K and supplies it to the rear nodal point 3.

The compensation circuit 5 comprises an inner nodal point 8, a frequency filter 9, a front buffer store 10 and a rear buffer store 11. Two multipliers 12, 13 are superordinate to the inner nodal point 8. The control deviation δx is supplied to the multiplier 12, a feedback signal R is supplied to the multiplier 13. The multipliers 12, 13 multiply the signals δx, R supplied thereto by a respective weighting factor γ, β and supply the products to the inner nodal point 8. The inner nodal point 8 adds the control deviation δx weighted with the weighting factor γ and the feedback signal R weighted with the weighting factor β and thus forms a further sum signal, subsequently referred to as inner sum signal. The inner sum signal supplies the inner nodal point 8 to the frequency filter 9.

The frequency filter 9 implements a frequency filtering. The frequency filter 9 can for this purpose be embodied in accordance with the diagram in FIG. 1 as a non-recursive digital filter for instance, in particular as a low pass filter. A filter order of the frequency filter 9 can be adjusted by adjusting corresponding parameters P. The frequency filter 9 supplies the correspondingly filtered signal to the front buffer store 10.

The front buffer store 10 implements a first propagation delay T1 of the signal supplied thereto. The front buffer store 10 supplies the accordingly delayed signal to the rear buffer store 11. Similarly the rear buffer store 11 implements a second propagation delay T2. The rear buffer store 11 outputs the correspondingly delayed signal as a feedback signal R.

An inner tapping point 14 is arranged between the front buffer store 10 and the rear buffer store 11. The compensation signal K is tapped at the inner tapping point 14 and supplied to the rear nodal point 3.

The frequency filter 9 comprises, as already mentioned, a filter order. The filter order corresponds to a delay time TF. According to the invention the frequency filter 9 and the two buffer stores 10, 11 are configured such that the relation $$TF+T1+T2=n \cdot T \quad (1)$$

applies. n is a whole number. The number n is generally as small as possible. The number n often comprises the value 1 or the value 2.

The controlled system 1, in conjunction with the normal closed loop control (i.e. without compensation circuit 5) comprises a propagation time TL. The propagation time TL is the time taken until a signal supplied to the front nodal point 2 effects a change in the actual value x. The rear buffer store 11 is configured in accordance with the invention such that the relation $$T2-TL=m \cdot T \quad (2)$$

applies. m is a whole number. The number m is generally as small as possible. The number m often comprises the value 0. In individual cases, the number m can comprise the value 1. Larger values should preferably not comprise the number m. The sum of the delay times TF, T1 of the frequency filter 9 and the front buffer store 10 is thus an integer multiple of the cycle duration T of the disturbance z minus the propagation time TL.

The first weighting factor γ and the second weighting factor β can preferably be adjusted in accordance with FIG. 1 by a user 15 of the control facility. The same preferably also applies to the parameters P of the frequency filter 9. As a result the compensation circuit 5 can be adjusted by the user 15 such that a stable closed loop control of the controlled system 1 is guaranteed. The weighting factors γ, β are preferably frequency-independent.

In order to adjust the compensation circuit 5, the control facility, like also in the prior art, is firstly parameterized as such, i.e. without the compensation circuit 5 and its parameterizable components 9, 10 and 11, so that the control facility controls the controlled system 1 as such in a stable manner. This procedure is known and trusted by persons skilled in the art and therefore does not need to be explained in more detail. The compensation circuit 5 is then activated, in other words a control-specific connection of the inner tapping point 14 is established with the rear nodal point 3.

Figure 3:
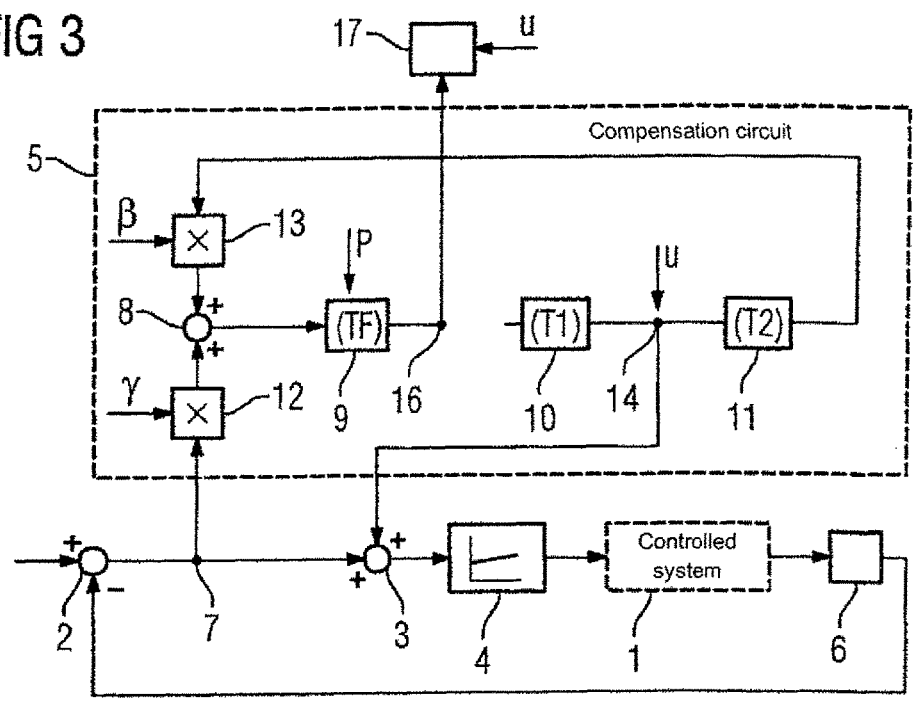
FIG. 3 shows a schematic diagram of the control facility in FIG. 1 with an open compensation circuit.

In order to determine suitable adjustments of the weighting factors γ, β and the parameters P of the frequency filter 9, an output 16 of the frequency filter 9 is further firstly separated from the inner tapping point 14 in accordance with FIG. 3. This state of the compensation circuit 5 is then referred to as an open compensation circuit 5. In this state (in other words with an open compensation circuit 5), a signal u is then applied to the inner tapping point 14 and the amplification is determined, which is produced at the output 16 of the frequency filter 9.

Figure 4:
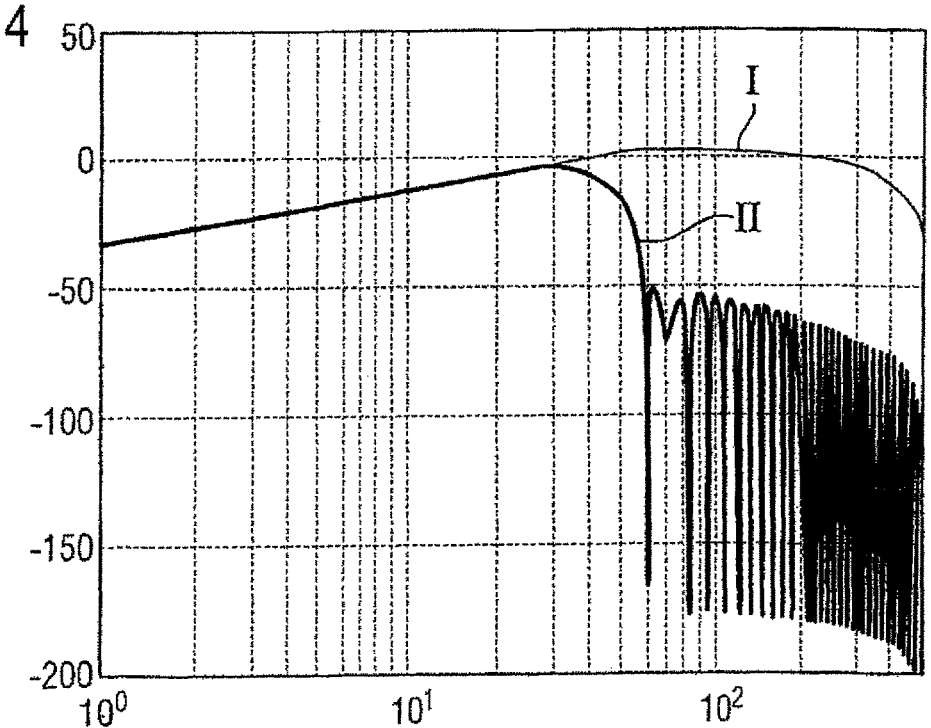
FIG. 4 shows a schematic diagram of frequency responses.

FIG. 4 shows by way of example the amplification as a function of the frequency. The frequency is plotted to the right in FIG. 4 in a logarithmic scale, the amplification is shown in decibels to the top. As apparent from FIG. 4, the amplification depends on the frequency of the signal u and on the adjustments of the weighting factors γ, β and the parameters P of the frequency filter 9. If the weighting factors γ and β both have the value 1, and the frequency filter 9 is parameterized such that it does not implement a filtering but instead acts as a pure buffer store, the amplification—see the curve designated with I in FIG. 4—is in many frequencies greater than 1. If by contrast the weighting factors γ and/or β assume smaller values, for instance lie between 0.6 and 0.8, and/or the frequency filter 9 is parameterized as a low pass filter, it is possible to ensure—see curve designated with II in FIG. 4—that the amplification is always less than or at most equal to 1 irrespective of the frequency of the signal u. The control facility also then remains stable with such a parameterization if the signal present at the output 16 of the frequency filter 9 is supplied to the inner tapping point 14 via the front buffer store 10 (and from there to the rear buffer store 11).

The amplification as a function of the frequency of the signal u is also often referred to as transmission function. According to FIG. 3 the transmission function can preferably be output to the user 15 of the control facility via a display facility 17. The user 15 can therefore adjust the weighting factors γ, β and the parameters P of the frequency filter 9 when the compensation circuit 5 is open, the latter reading the resulting transmission function and then varying the weighting factors γ, β and the parameters P of the frequency filter 9 if necessary until the amplification is always less than or at most equal to 1 irrespective of the frequency of the signal u.

In individual cases, it is possible for the transmission function to be less than 1 for all frequencies, although the frequency filter 9 is parameterized such that it does not perform a filtering, but instead only acts as a (further) buffer store. The frequency filter 9 is in this case degraded. A (real) filtering is however generally necessary. In particular the frequency filter 9 can be parameterized such that it dampens the amplification precisely in frequency ranges in which the transmission function would on the other hand be greater than 1.

The parameterization of the frequency filter 9 preferably takes place such that the filter order is as low as possible. The behavior of the compensation circuit 5 then improves with higher frequencies of the disturbance z. Moreover, attempts are generally made to adjust the so-called breaking frequency of the frequency filter 9 as high as possible.

Figure 5:
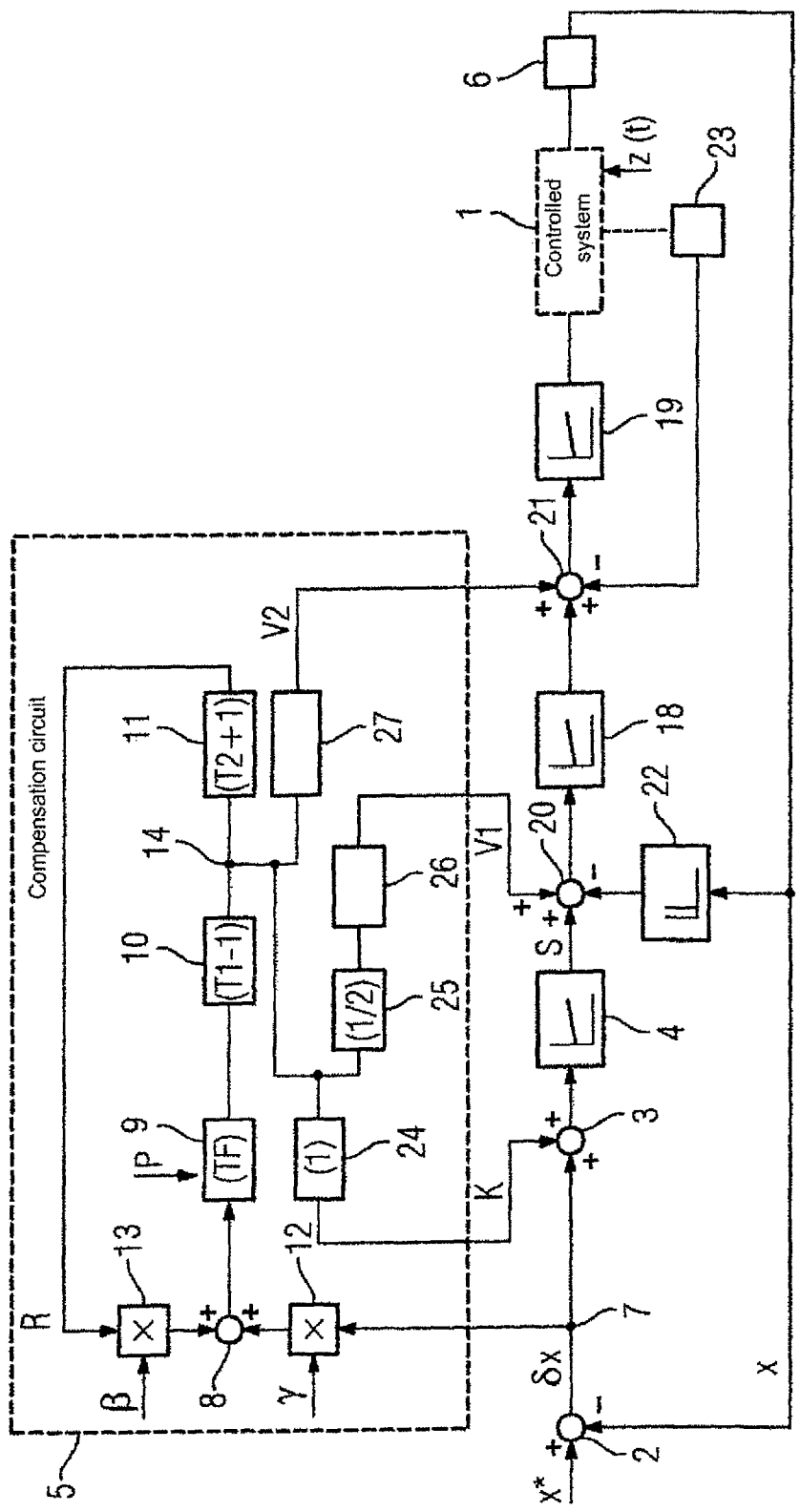
FIG. 5 shows a schematic diagram of a modification of the control facility in FIG. 1.

In many instances the control facility is embodied as a cascaded control facility. In the case of an embodiment of the controller 4 as a speed or rotational speed controller, an acceleration, moment or current controller can underlie the controller 4. Similarly in the case of an embodiment of the controller 4 as a position controller, a speed or rotational speed or acceleration, moment or current controller can be subordinate to the controller 4. FIG. 5 shows an embodiment in which the controller 4 is embodied as a position controller which is subordinate to a speed or rotational speed controller

18. An acceleration, moment or current controller 19 is subordinate to the speed or rotational speed controller 18 for its part.

In the presence of subordinate controllers 18, 19, a respective nodal point 20, 21 is superordinate to the respective subordinate controller 18, 19. The output signal of the respective superordinate controller 4, 18 and the associated actual value are supplied on the one hand to the respective nodal point 20, 21 as a target value. For instance, the actual value for the speed or rotational speed controller 18 can be derived from the actual position value x by means of a differentiator 22. An actual value for the current controller 19 can be acquired for instance by means of a corresponding measuring facility 23.

In the case of the embodiment of the control facility as a cascaded control facility, a compensation can take place by means of the compensation signal K in accordance with the diagram in FIG. 5 similarly to FIG. 1. It is also possible however to supply a pre-control signal V1 to the subordinate controller 18, to supply a pre-control signal V2 to the subordinate controller 19 or to supply a respective pre-control signal V1, V2 to both subordinate controllers 18, 19. The pre-control signals V1, V2 for the subordinate controllers 18, 19 are derived from the signals in accordance with FIG. 5, said signals being stored in the front buffer store 10.

In particular, in accordance with the diagram in FIG. 5, the buffer stores 9, 10 are modified marginally compared with the diagram in FIG. 1. Moreover, the compensation circuit 5 comprises additional buffer stores 24, 25. Finally, the compensation circuit 5 comprises determination elements 26, 27.

The modification of the buffer store 9, 10 consists in the front buffer store 9 being marginally shortened, generally by one storage cell. Because the overall control facility is generally operated in switch-mode, this shortening corresponds to a shortening by a clock cycle. The rear buffer store 10 is lengthened by the same amount. The sum of the propagation time delays T1, T2 of the front and rear buffer store 9, 10 is therefore unchanged.

The additional buffer store 24 has exactly the length by which the front buffer store 9 is shortened. In the embodiment according to FIG. 5, the compensation signal K is thus switched on at precisely the same point in time as in the embodiment according to FIG. 1.

The determination element 26 performs the same determinations, which are required to determine the pre-control signal V1. A determination time is generally required herefor. The additional buffer store 25 is dimensioned such that it effects a delay, which, in conjunction with the delay effected by the determination element 26, corresponds to the length of the additional buffer store 24.

The determination element 27 performs the same determinations, which are required to determine the pre-control signal V2. A determination time is generally required herefor. This determination time is generally greater than the determination time of the determination element 26.

No buffer store is subordinate or superordinate to the determination element 27. This is possible in that the additional buffer store 24 is dimensioned such that its delay corresponds to the determination time of the determination element 27.

The determination times of the determination elements 26, 27 can correspond individually to integer multiples of the clock cycle. The determination times nevertheless often only correspond to integer multiples of half of the clock cycle. It is in particular possible for the determination time of the determination element 26 to correspond to a half clock cycle and for the determination time of the determination element 27 to correspond to a full clock cycle. In such a case the additional buffer store 25 must realize a delay by a half clock cycle. In order to be able to realize a delay of this type (or also a different delay which differs from a full clock cycle), the additional buffer store 25 is embodied such as is explained in more detail below in conjunction with FIG. 6. In conjunction with FIG. 6, how the buffer store 25 has to be embodied is explained here in order to be able to realize as a result a delay between 0 and a full clock cycle. This is sufficient because a realization of full clock cycles can be realized completely by a corresponding number of storage cells of the buffer store 25. Moreover, buffer stores other than buffer store 25 can naturally also realize a delay between 0 and a full clock cycle on account of an embodiment similar to FIG. 6.

Figure 6:
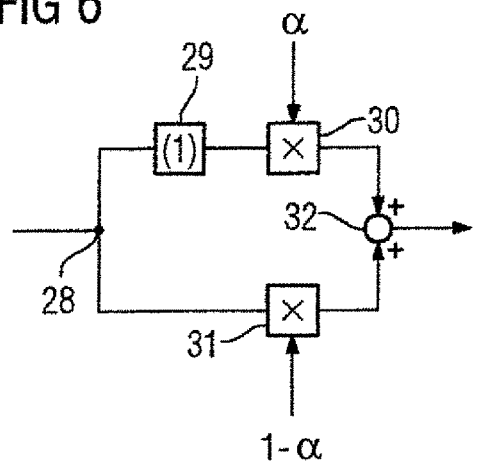
FIG. 6 shows a schematic diagram of a possible design of a buffer store.

According to FIG. 6, the buffer store 25 comprises a nodal point 28, an individual storage cell 29, two multipliers 30, 31 and a nodal point 32. The signal supplied to the buffer store 25 is supplied to the two branches at nodal point 28, of which one contains the storage cell 29 and the multiplier 30 and the other contains the multiplier 31. The storage cell 29 effects a delay by a full clock cycle. Weighting factors a and 1-a are supplied to the multipliers 30, 31. A summation of the two weighted signals takes place at the nodal point 32. As a result, the structure according to FIG. 6 affects a delay by a fractions of a clock cycle.

In some cases the cycle duration T is constant. In other cases the cycle duration T varies over the course of time t. If the cycle duration T varies over the course of time t, the control facility in FIG. 1 is preferably modified in accordance with the embodiment according to FIG. 7. A similar modification would also be possible with respect to the control facility in FIG. 5.

Figure 7:
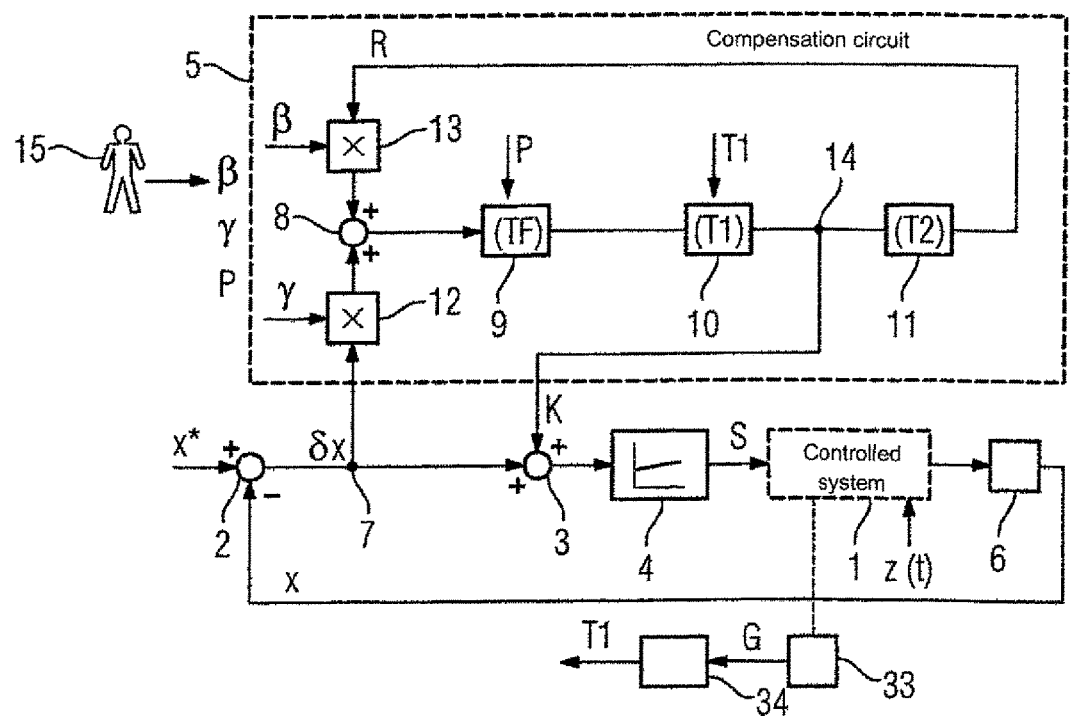
FIG. 7 shows a schematic diagram of a further modification of the control facility in FIG. 1.

According to FIG. 7, a variable G is acquired by means of a measuring facility 33, which is characteristic of the cycle duration T. The variable G is supplied to a determination facility 34, which determines the first delay time T1 of the front buffer store 10 therefrom and accordingly configures the front buffer store 10 dynamically. The first delay time T1 is thus traced dynamically. The variable G as such can be determined if required. If the controlled system 1 is embodied for instance as a drive, in some cases the frequency of the disturbance z can be proportional to a rotational speed of the drive. The cycle duration T is in this case reciprocal to the rotational speed. If the rotational speed is determined in such a case by means of the measuring facility 33, the cycle duration T can be concluded as a result.

In many instances the controlled system 1 is embodied as a rotary axis, in other words as an axis which rotates and whose physical state thus repeats with each full revolution. Moreover, in such cases the controller 4 is often embodied as a position controller. If in such instances the rotational speed of the rotary axis and thus the cycle duration T can vary, the control facility in FIG. 1 is preferably modified, as is explained in more detail below in conjunction with FIG. 8. Similar modifications would also be possible with respect to the control facilities in FIG. 5 and FIG. 7.

Figure 8:
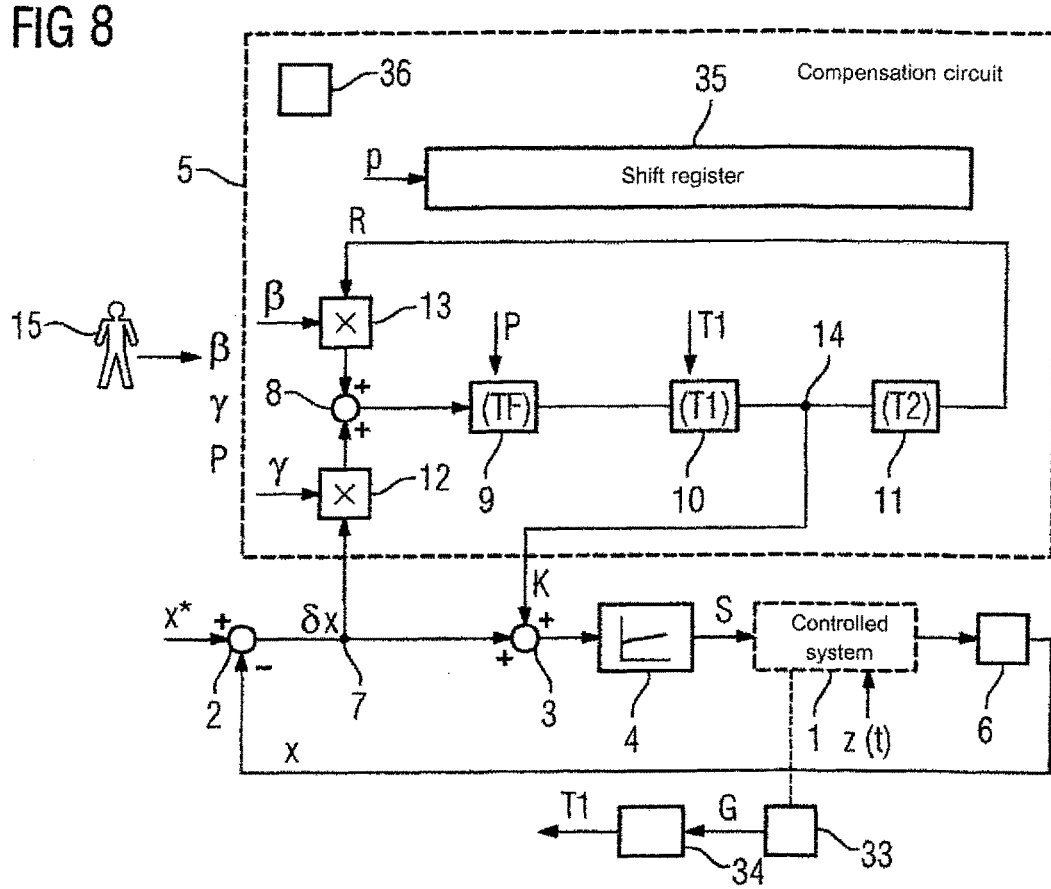
FIG. 8 shows a schematic diagram of a further modification of the control facility in FIG. 1.

According to FIG. 8, an associated position value p is also supplied in each case to the compensation circuit 5 in addition to the control deviation δx. The position value p can correspond to the target value x*, the actual value x or a combination of the two values x*, x. The compensation circuit 5 also comprises a shift register 35, into which the position values p are inscribed. The inscription of the position values p takes place in synchrony with the takeover of the control deviation δx in the frequency filter 9. An associated position value p is thus assigned in particular to the signals (in precise terms also the signals processed within the frequency filter 9) stored in the front and in the rear buffer stores 10, 11.

Figure 9:
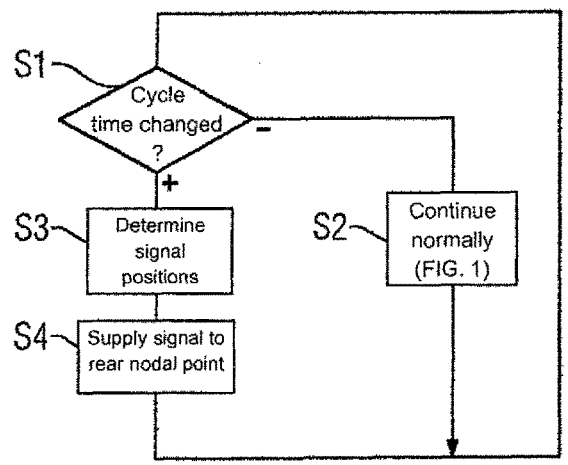
FIG. 9 shows a schematic diagram of a flow chart.

In the case of the embodiment according to FIG. 8, a control facility 36 of the compensation circuit 5 checks in accordance with FIG. 9 in a step S1 whether the cycle duration T of the disturbance z has changed. If this is not the case, the control facility 36 moves to a step S2. Step S2 proceeds as was explained above in conjunction with FIG. 1. If conversely the cycle duration T of the disturbance z has changed, in other words the cycle duration T has varied, the control facility 36 moves to a step S3. In step S3 the control facility 36 determines, by taking the position values p stored in the shift register 35 into account, the positions of the signal stored in the front or in the rear buffer store 10, 11 that are to be supplied to the rear nodal point 3 as a compensation signal K. The corresponding signal is supplied to the rear nodal point 3 in a step S4.

The procedure in FIG. 9 generally also then produces good results, if the cycle duration T changes relatively quickly. This applies in particular if the correct point in the front and rear buffer store 10, 11 is determined within the scope of a few iterations (for instance 3 to 5 iterations).

Figure 10:
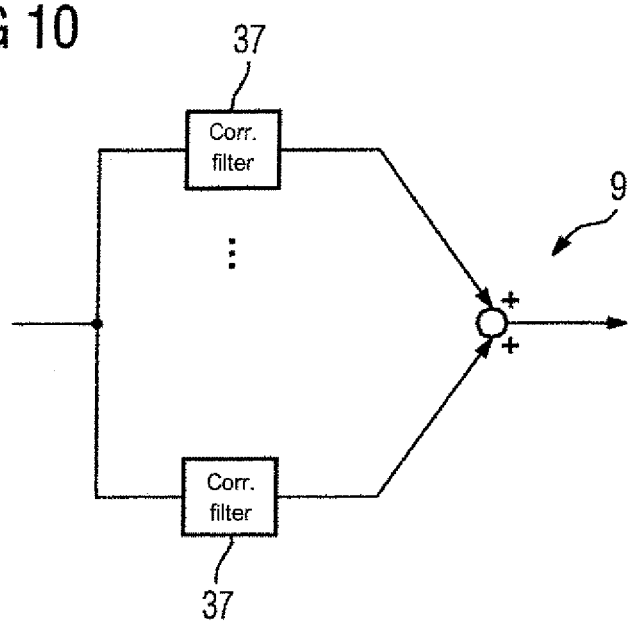
FIG. 10 shows a schematic diagram of a possible embodiment of a frequency filter and FIG. 11 shows a schematic diagram of a control facility for controlling a controlled system.

The present invention was explained above in conjunction with a frequency filter 9, which is embodied as a non-recursive digital filter. The frequency filter 9 can however alternatively comprise a number of orthogonal correlation filters 37 according to the diagram in FIG. 10, by means of which an individual frequency component is filtered out respectively. Orthogonal correlation filters 37 calculate the coefficients of Fourier rows by orthogonal correlation and then generate the monofrequent and phase-correct signal. The design and mode of operation of orthogonal correlation filters 37 are generally known to persons skilled in the art and do not therefore need to be explained in greater detail.

The number of orthogonal correlation filters 37 can be determined if necessary. A single orthogonal correlation filter 37 is if necessary available as a minimum. If a number of orthogonal correlation filters 37 are available, these are switched in parallel in accordance with the diagram in FIG. 10.

Figure 11:
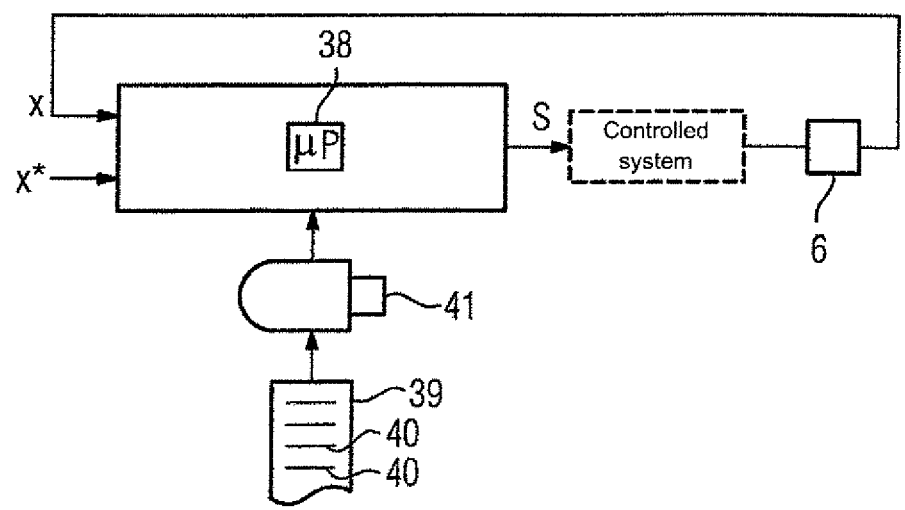

The control facility is preferably embodied as a software programmable control facility according to the diagram in FIG. 11. It therefore includes a microprocessor 38. The control facility is in this case programmed with a software module 39. On account of the programming with the software module 39, the control facility is embodied in accordance with the invention. The software module 39 includes machine codes 40. The processing of the machine code 40 by the control facility thus means that the control facility is embodied in accordance with the invention.

The software module 39 can be supplied to the control facility in broadly speaking any manner. In particular, the software module 39 can be stored on the data carrier 41 in machine-readable form. The diagram in FIG. 11, in which the data carrier 41 is shown as a USB memory stick, is nevertheless understood to be purely exemplary and non-restrictive.

In summary, the present invention thus relates to the following situation:

A control facility for controlling a controlled system 1 comprises a front nodal point 2, a rear nodal point 3, a controller 4 and a compensation circuit 5. An actual value x and a corresponding target value x* acquired on the output side of the controlled system 1 are supplied to the front nodal point 2. It determines a control deviation δx. The acquired actual value x is subject to a disturbance z. The control deviation δx and a compensation signal K are supplied to the rear nodal point 3. It supplies an external sum signal formed from the control deviation δx and the compensation signal K to the controller 4. The controller 4 determines a control signal S for the controlled system 1 and outputs the same to the controlled system 1. An external tapping point 7 is arranged between the front and the rear nodal point 2, 3, at which the control deviation δx is tapped and supplied to the compensation circuit 5. The compensation circuit 5 determines the compensation signal K and supplies it to the rear nodal point 3. The compensation circuit 5 comprises an inner nodal point 8, a frequency filter 9, a front buffer store 10 and a rear buffer store 11, The control deviation δx and a feedback signal R are supplied to the inner nodal point 8 weighted with weighting factors γ, β. The inner nodal point 8 supplies an inner sum signal formed therefrom to the frequency filter 9. The frequency filter 9 implements a frequency filtering and supplies the filtered signal to the front buffer store 10. The buffer stores 10, 11 implement a respective propagation delay T1, T2 and supply the correspondingly delayed signal to the rear buffer store 11 or output it as a feedback signal R. An inner tapping point 14 is arranged between the buffer stores 10, 11, at which the compensation signal K is tapped. The sum of the delay times TF, T1, T2 of the frequency filter 9 and both buffer stores 10, 11 is an integer multiple of the cycle duration T of the disturbance z. The sum of the delay times TF, T1 of the frequency filter 9 and the front buffer store 10 is an integer multiple of the cycle duration T of the disturbance z minus the propagation time TL, which elapses until a signal supplied to the front nodal point 2 effects a change in the actual value x.

The present invention has many advantages. Periodic disturbances can be adjusted almost completely. The known conventional window functions can be used for the design of the frequency filter 9, as are known from the digital signal processing. By checking the transmission function with an open compensation circuit, the stability of the closed loop control can be monitored in advance.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A control facility for controlling a controlled system, comprising:
   a front nodal point having a first input receiving a target value and a second input receiving an actual value outputted by the controlled system, said actual value comprising a disturbance having a cycle duration, the front nodal point further having an output supplying a difference value corresponding to a difference between the target value and the actual value,
   a compensation circuit receiving the difference value and supplying a compensation signal,
   a rear nodal point having a first input receiving the difference value and a second input receiving the compensation signal, and further having an output supplying a sum value corresponding to a sum of the difference value and the compensation signal, and a controller receiving the sum value and supplying a control signal to the controlled system, wherein the compensation circuit comprises a first multiplier circuit forming a first product by multiplying the difference value with a first weighting factor, a second multiplier circuit forming a second product by multiplying a feedback signal with a second weighting factor, wherein the feedback signal is generated by frequency filtering, with a frequency filter having a filter delay time, a sum signal outputted by an inner nodal point and representing a sum of the first product and the second product, and by time-delaying the sum in a front buffer store having a first propagation delay and supplying the compensation signal, and thereafter time-delaying the compensation signal in a rear buffer store arranged downstream of the front buffer store and having a second propagation delay, wherein the a sum of the filter delay time, the first propagation delay and the second propagation delay is an integer multiple of the cycle duration of the disturbance and a sum of the filter delay time and the first propagation delay is an integer multiple of the cycle duration of the disturbance minus a propagation time, which elapses until a change in a signal supplied to the front nodal point causes a change in the actual value.

2. The control facility of claim 1, wherein the frequency filter is embodied as a non-recursive digital filter.

3. The control facility of claim 2, wherein the frequency filter is embodied as a low pass filter.

4. The control facility of claim 2, wherein a filter order of the frequency filter is adjustable.

5. The control facility of claim 1, wherein the frequency filter comprises a plurality of orthogonal correlation filters, with each of the correlation filters designed to filter out an individual frequency component.

6. The control facility of claim 1, wherein the first weighting factor and the second weighting factor are adjustable.

7. The control facility of claim 1, wherein an output of the frequency filter is disconnectable from an input of the front buffer store.

8. The control facility of claim 7, wherein the first weighting factor, the second weighting factor and the frequency filter are adjusted such that, when the output of the frequency filter is disconnected from the input of the front buffer store, an amplification from an inner tapping point disposed between the front buffer store and the rear buffer store to the output of the frequency filter is less than or at most equal to 1 irrespective of a frequency of a signal present at the inner tapping point.

9. The control facility of claim 8, further comprising an output device configured output the amplification as a function of the frequency to a user of the control facility.

10. The control facility of claim 1, further comprising at least one additional controller subordinate to the controller, wherein a pre-control signal derived from signals stored in the front buffer store is supplied to the subordinate controller.

11. The control facility of claim 1, wherein the cycle duration varies over time and wherein at least the propagation delay of the front buffer store dynamically tracks the cycle duration.

12. The control facility of claim 11, wherein the controlled system is embodied as a rotary axis and the controller is embodied as a position controller, wherein the signals stored in the front and in the rear buffer store each have associated therewith a respective position value, and wherein when the cycle duration varies, the compensation circuit determines the compensation signal by taking into account the associated position values.

13. The control facility of claim 1, wherein the control facility is embodied as a software-programmable control facility.

* * * * *